United States Patent [19]

Bailey et al.

[11] 4,197,650
[45] Apr. 15, 1980

[54] COMPACT COLUMN GAGE

[75] Inventors: Kurt W. Bailey, Royal Oak; Richard O. Juengel, Romeo, both of Mich.

[73] Assignee: The Valeron Corporation, Oak Park, Mich.

[21] Appl. No.: 936,575

[22] Filed: Aug. 22, 1978

[51] Int. Cl.$^2$ ............................................. G01B 7/02
[52] U.S. Cl. ............................. 33/143 L; 33/147 N; 33/172 E; 235/92 EA; 340/754
[58] Field of Search ............ 33/143 L, 147 N, 148 H, 33/149 J, 172 E, 174 L, 178 E; 235/92 M, 92 MT, 92 DN, 92 EA, 92 ST; 340/372, 381, 378.1, 678, 753, 754, 767

[56] References Cited

U.S. PATENT DOCUMENTS

| | | | |
|---|---|---|---|
| 3,557,462 | 1/1971 | Kiewicz et al. | 33/174 L |
| 3,754,121 | 8/1973 | Delay et al. | 235/92 EA |
| 3,805,036 | 4/1974 | Michaud et al. | 33/174 L |
| 3,824,581 | 7/1974 | Ohno | 340/753 |
| 3,892,043 | 7/1975 | Bonikowski | 33/143 L |
| 3,895,875 | 7/1975 | Kitaura et al. | 235/92 EA |
| 3,906,345 | 9/1975 | Bentolasi | 235/92 EA |
| 4,014,011 | 3/1977 | Ashkin | 235/92 EA |
| 4,038,756 | 8/1977 | Smith et al. | 33/172 E |

FOREIGN PATENT DOCUMENTS

2439102  2/1976  Fed. Rep. of Germany ........ 340/378.1

OTHER PUBLICATIONS

Burroughs, "100 Element Dual Linear Bar Graph Display", Mar. 1976, Bulletin No. 5005D.
BG12203-2, "Dual Bar Graph Displays".

*Primary Examiner*—Richard R. Stearns
*Attorney, Agent, or Firm*—Krass & Young

[57] ABSTRACT

A part sizing system in which the upper and lower tolerance limits are illuminated on the same bar graph display. Electrical representations of the upper and lower tolerance limits are alternately coupled to the bar graph display so as to superimpose visual indications of both limits on one another, with each limit being distinguishable from each other by different light intensities. In one embodiment this bar graph display is disposed adjacent another bar graph display in the same housing. The other bar graph display is utilized to provide a visual indication of the output of at least one variable reluctance transducer which measures the size of the part under test. Improved transducer excitation circuitry is also provided for insuring accurate measurements.

34 Claims, 7 Drawing Figures

COMPACT COLUMN GAGE

BACKGROUND OF THE INVENTION

This invention relates to part sizing or gaging devices for indicating part size deviation of a machined part or the like from a predetermined nominally ideal size.

In the course of machining precision parts it is customary to check the size of the part by comparing it to a part of nominally ideal or perfect size. One well-known device for accomplishing this is a vertical glass tube through which air is caused to flow in varying rates according to the size deviation of a part under inspection. The vertical air column supports an indicator float in a vertical position which is related to part size. Thus, a given float position may be equated to ideal or mean size while positions above and below the given position may be equated to part sizes which are over and under the mean value, respectively.

Several prior art devices have provided electronic implementations for such a gage. For example, in U.S. Pat. No. 4,038,756 to Smith et al, issued Aug. 2, 1977 and assigned to the same assignee as the present invention, a vertical column of light emitting diodes (LED's) is utilized to provide a visual indication of the part size under test by lighting an appropriate LED in the column. In this device the probe output signal when measuring an ideal part is utilized to zero the apparatus so that an LED in the middle of the display is lit. If the test part is larger or smaller than the ideal part, an LED is lit above or below the middle LED, respectively, and it is displaced from the middle LED a distance representing the degree of deviation. Manually slidable overlay elements on the display are positioned along the column to indicate the upper and lower limits of the degree of deviation that can be tolerated for a given part. Unfortunately, these overlays are susceptible to being tampered with or otherwise accidentally moved due to vibrations, etc.

Obviously, accuracy is of utmost importance in part sizing systems. The most widely used probes are of a variable reluctance type in which the position of the probe induces a corresponding voltage change in a winding surrounding the probe element. An excitation voltage applied to the windings is used to set up the necessary inductive coupling between the probe element and its windings. It is imperative that the excitation voltage remain constant, otherwise the probe output signal would reflect such a change and not provide a true indication of the size of the part under test as compared with an earlier measured part. One method of maintaining a constant excitation voltage is shown in copending U.S. patent application No. 898,831 to Juengel et al entitled "Multiple Probe Gage System", filed Apr. 21, 1978 and having the same assignee as the present invention. A feature of the present invention is to provide improved and more economical circuitry for maintaining a constant excitation voltage.

OBJECTS AND SUMMARY OF THE INVENTION

Therefore, it is an object of this invention to provide a part sizing system in which the tolerances are visually indicated on a bar graph display.

It is another object of this invention to provide a system which permits one bar graph display to provide distinguishable visual representations of a plurality of inputs.

It is an additional object of this invention to provide a part sizing system in which both the upper and lower tolerance limits are visually indicated on one bar graph display.

Another object of this invention is to provide a more accurate and flexible part sizing system.

Briefly, these and other objects of this invention are accomplished by providing means for supplying electrical representations of two discrete signals, for example, the desired upper and lower tolerance limits in a part sizing system. These signals are coupled to one bar graph display in such manner that visual indications of these limits are superimposed on the same display, with each limit being distinguishable from each other by different light intensities. Preferably, the limit signals are coupled to the bar graph display by a switching arrangement in which the signals are alternately coupled to the input of the bar graph display for different periods of time.

Another feature of this invention provides improved excitation circuitry to at least one variable reluctance probe. The output of the excitation circuitry is continually compared with a reference voltage. An error signal is generated corresponding to the difference, if any, between the two signals, with the error signal being fed back to the excitation circuitry to compensate for the difference.

Other features of this invention include adjustable means for selectively determining the measuring unit system to be associated with the visual indications provided by the display means; improved circuitry for electrically determining whether the part size under test has exceeded tolerance levels, and means for selectively summing or subtracting output signals from a plurality of different measuring probes.

BRIEF DESCRIPTION OF THE DRAWINGS

Other advantages and objects of this invention will become apparent upon reading the following description and by reference to the accompanying drawings in which.

DESCRIPTION OF THE PREFERRED EMBODIMENTS

It should be noted from the outset that while the present invention finds particular utility in part sizing systems, the bar graph display control circuitry feature of this invention is applicable to many types of uses. For example, it can be employed in any system in which visual representations of two or more sensing devices are desired to be displayed. Hence, one advantage of this invention, being the ability to provide a plurality of visual representations on one display, can be advantageously utilized in a wide variety of applications.

Figure 1:
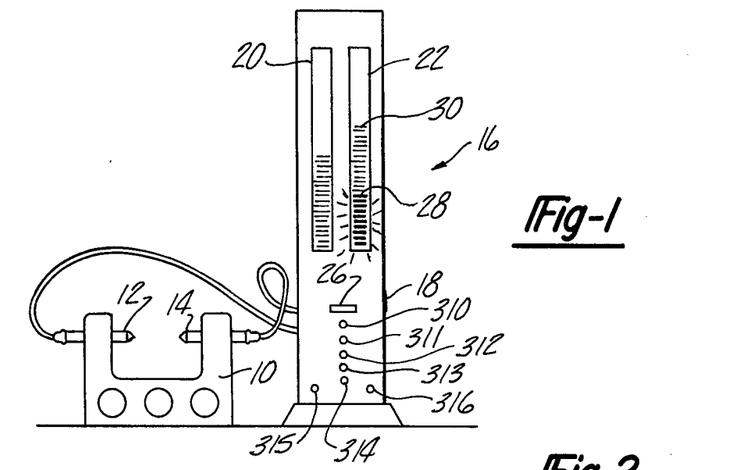
FIG. 1 is a plan view of one embodiment of the part sizing system of this invention illustrating the measuring probes and the display unit.

The part sizing system of the preferred embodiment is shown in FIG. 1. A base 10 secures a plurality of plunger type probes 12 and 14 for measuring the part under test. In this example, only two probes are shown. However, it should be realized that any combination of probes can be utilized depending upon the loading constraints of the excitation circuitry or, alternatively, only one probe can be used. Probes 12 and 14 are variable reluctance transducers which provide a variable output signal representative of the displacement caused by the part interposed therebetween. The outputs from probes 12 and 14 are coupled to electronic circuitry contained in display unit 16. Display unit 16 includes a housing 18 which holds two adjacent bar graph displays 20 and 22, along with a plurality of range selector indicators 311–314, measuring unit indicators 315, 316, and a limit indicator 26 on the front panel thereof. Bar graph displays 20 and 22, in this embodiment, are commercially available displays such as the 100 Element Dual Linear Bar Graph Display sold by the Burroughs Corporation under the trademark SELF-SCAN. Bar graph display 20 is utilized to illustrate the size of the part measured by probes 12 and 14, whereas bar graph 22 is utilized to display both the upper and lower tolerance limits. As can be seen in FIG. 1, both the upper and lower limits are visually superimposed upon the same bar graph display, with the lower limit 28 having a greater illumination intensity than the upper limit 30. This is accomplished electronically by the circuitry that will now be discussed.

Figure 2:
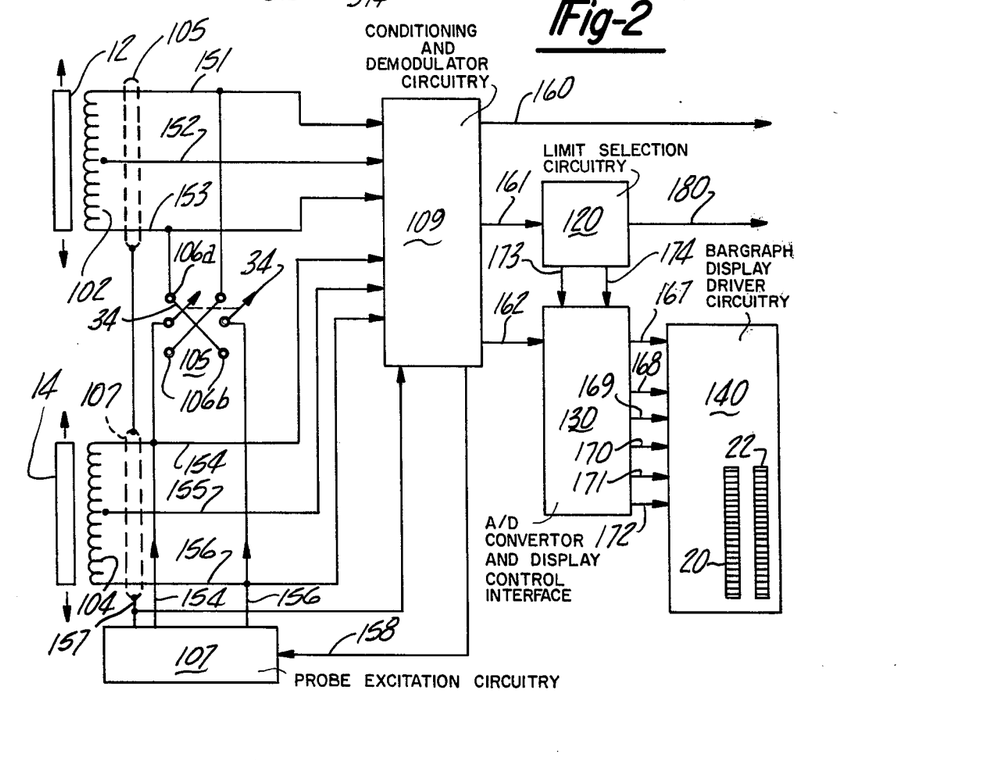
FIG. 2 is a block diagram illustrating the major components of the circuitry of this invention.

Referring now to FIG. 2, there is shown a block diagram of the major components of the electronic circuitry of the present invention. Probe excitation circuitry 107 provides an AC signal over lines 154, 156 to the respective windings 102, 104 surrounding probes 12 and 14. As mentioned above probes 12 and 14 are known variable reluctance transducers. Briefly, they operate on the principle that movement of the probe, which is made of a ferromagnetic material such as ferrite, induces a corresponding voltage change relative to the outer terminals of a center tapped winding which surrounds the probe. The probe output signals are coupled to a signal conditioning and demodulator circuit 109. In this example, the excitation signal over lines 154 and 156 are applied directly to the windings 104 of probe 14. Excitation signal supply lines 154, 156 are also coupled to windings 102 of probe 12 by lines 151 and 153 through a double pole, double throw switch 105. If wipers 34 of switch 105 contact poles 106A, the excitation signal applied to probe 12 is of the same polarity that is supplied to probe 14. Consequently, the output signals from probes 12 and 14 will be summed together by circuit 109. On the other hand, if wipers 34 of switch 105 contact poles 106B, the excitation signal to probe 12 will be of an opposite polarity. Consequently, signals between probe 12 and 14 will be subtracted by conditioning and demodulator circuitry 109. For purposes of this invention, the probe output signal will be deemed to be of a positive sense when caused by mechanical retraction of the probe element. As noted above, the probe can be conditioned to provide an output signal of a negative sense by reversing the polarity of the excitation signal via switch 105. A shielded cable having lines 151, 152 and 153 therein couple the signal from probe 12 to circuitry 109. Similarly, another shielded cable having lines 154, 155 and 156 couple probe 14 signals to circuitry 109. The cable shields 105, 107 are grounded via line 157.

Line 158 supplies a synchronization signal from the demodulator portion of circuitry 109, which is utilized by the excitation circuitry 107 as will later be discussed. Circuitry 109 provides an output signal which is representative of the signals from probes 12 and 14 measuring the part under test. Line 160 provides an externally available output signal which is proportional to the probe position. Line 161 is coupled to a limit selection circuitry 120. Circuitry 120 compares the input signal with electronic representations of the upper and lower tolerance limits. If the input signal does not fall between the upper and lower limits, a signal is supplied to an indicator such as lamp 26 shown in FIG. 1. In addition, the output line 180 can be coupled to a relay located in the machinery which is making the parts being tested. In such manner the machinery such as a stamping device, can be automatically stopped in the event that the parts being made are not within the tolerance limits. Circuitry 120 also supplies signals over lines 173 and 174 which represent the selected lower and upper tolerance limits, respectively. Lines 173 and 174 are coupled, along with line 162 from circuitry 109, to analog-digital (A/D) convertor and display control circuitry 130. Circuitry 130 converts the analog signals of probe signal 162, lower limit signal 173, and upper limit signal 174 into digital signals which are compatible with the bar graph display. The output lines 167–172 from circuitry 130 are coupled to display driver circuitry 140 which drives the bar graph displays 20 and 22. Line 167 provides a signal which is utilized to control the anode of bar graph display 20. Lines 168–170 provide a three phase scanning input for the cathodes of both bar graph displays 20 and 22. Line 171 provides a reset signal to reinitialize the scan of the cathodes. Line 172 provides a signal which controls the anode of bar graph display 22.

Figure 3:
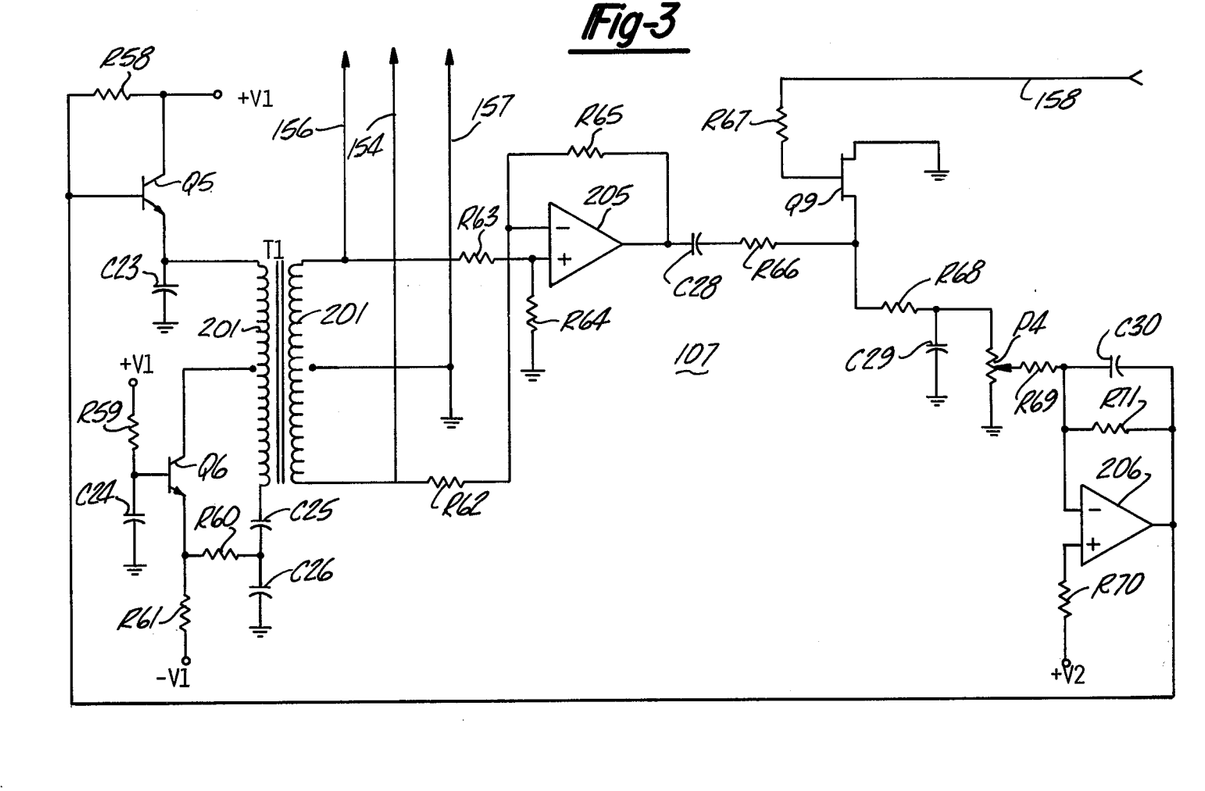
FIG. 3 is a schematic diagram showing the details of the probe excitation circuitry shown in FIG. 2.

The details of the probe excitation circuitry 107 are shown most clearly in FIG. 3. The primary winding of a grounded center tapped transformer T1 and capacitor C23 combine to form an LC resonant circuit oscillator in which transistor Q6 provides an active element operated in class C for efficient operation. Capacitors C25 and C26, along with resistors R60 and R61 provide a small amount of negative feedback to transistor Q6 to provide a stable operation as is known in the art. Resistor R59 coupled to source +V1 provides a small amount of DC bias to insure initial oscillation of the circuit. Thus, an AC signal is induced in the secondary winding of transformer T1 and provides the probe excitation signal over lines 154, 156. According to a feature of this invention this signal is also monitored to insure that the excitation signal remains constant to thereby insure accurate readings.

The excitation signal is coupled to and is amplified by operational amplifier 205. The synchronization signal 158 and transistor Q9 combine to form a shunt chopper to half-wave rectify the output signal of amplifier 205. This signal is then filtered by capacitor C29 to provide a DC signal of a level corresponding to the amplitude of the amplified excitation signal. This DC signal is coupled to one input of error amplifier 206. A fixed reference voltage derived from source V2 is coupled to the other input of amplifier 206. The output of amplifier 206 is thus an error signal representative of the difference between the two signals, if any. Potentiometer P4 is utilized to initially adjust the biasing voltage Vcc to transistor Q5 thereby determining the amplitude of the oscillations of the LC resonant circuit. During subsequent operation of the circuitry, if there is an error signal generated by amplifier 206, it is fed back to a controllable DC power supply comprised of transistor Q5. Accordingly, any subsequent deviation of the excitation signal to the probes is immediately detected and automatically compensated by feeding back a signal to the power supply which, in turn, controls the amplitude of the oscillator. Such deviations can be caused by a change in temperature, load, component parameters, etc.

It is a feature of this invention that the secondary winding of transformer T1 is bifilar wound. As is known in the art, a bifilar wound transformer is made by folding a conductor exactly in half and winding it around the core. Hence, the outputs on outer terminals 154, 156 have exactly the same amplitude with respect to grounded center tap line 157 but are 180° out of phase.

Figure 4:
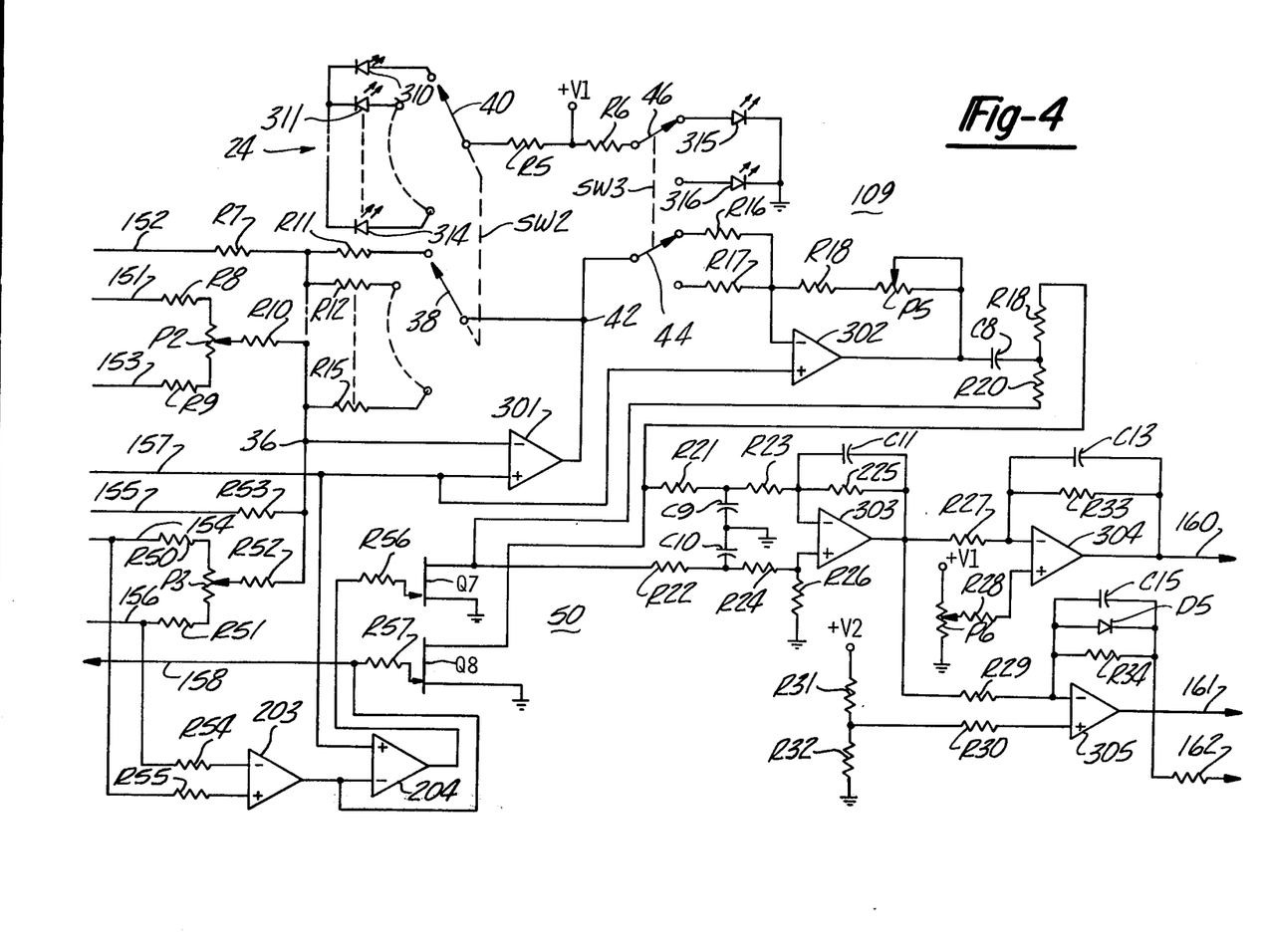
FIG. 4 is a schematic diagram showing the details of the probe signal conditioning and demodulating circuitry shown in FIG. 2.

Referring to FIG. 4, the probe output signals (over lines 151, 153 for probe 12, and over lines 154, 156 for probe 14) are coupled to the signal conditioning and demodulator circuit 109. Zero adjust potentiometers P2, P3 are utilized to initially zero the system. When a part is being measured the probe signals are either summed together or subtracted at junction 36 depending on the position of switch 105 as discussed above. Comparator 301 compares this signal with reference ground over line 157.

The position of switch SW2 determines the range selection for the part sizing system. Hence, wiper 38 connects the appropriate feedback resistor R11-R15 to amplifier 301. Similarly, wiper 40 of switch SW2 couples an appropriate indicator 310-314 to a source of potential V1 so that it will illuminate on the front panel of display unit 16.

Thus, at node 42 there appears an AC signal proportional to the probe displacement due to the measured part which has been amplified by the gain factor depending upon the range selection. This signal is further conditioned according to a feature of this invention by selecting, via switch SW3, either of two summing resistors R16 or R17 which provides for either an English or metric scaling factor, selectively, to be applied to the probe signal. Wiper 44 of switch SW3 therefor thus connects either resistor R16 or R17 to the input of amplifier 302. As is known in the art, the gain factor of such operational amplifiers is determined by the ratio between the input resistor and the feedback resistor. Potentiometer P5 provides the ability to initially adjust the gain of amplifier 302 to correspond to either an English or metric representation depending upon the value chosen for R16 or R17. Wiper 46 of switch SW3 activates either LED 315 or 316 providing a visual indication of the selection of English or metric measuring systems on display 16.

The thus conditioned AC signal is then coupled to a demodulator circuit 50 which is a balanced, synchronous demodulator with amplifier 303 operating in a differential DC amplifier mode. Demodulator 50 forms no part of this invention and thus can be performed by a variety of demodulators known in the art. N-channel JFET transistors Q7 and Q8 act as two phase shunt choppers needed for demodulation. Transistors Q7 and Q8 are driven by square waves which are 180° out of phase. These signals are synchronous with the probe excitation voltage due to the action of amplifier 203 and amplifier 204. Amplifier 203 is a differential comparator across the excitation voltage (from lines 154 and 156) and amplifier 204 is a comparator which inverts the signal from amplifier 203. The synchronous half wave signals produced by transistors Q7 and Q8 are filtered and differentially amplified by differential amplifier 303. Thus, the output of amplifier 303 is a DC signal proportional to the probe output signal as conditioned by the range selection and measuring unit selection circuits described above.

Amplifier 304 is a DC amplifier used to provide an externally available output on line 160 which is proportional to probe position. This output may be level shifted or amplified as desired, by the use of appropriate associated components, as is known in the art.

Amplifier 305 is another DC amplifier whose purpose is to condition the probe signal prior to the analog to digital conversion by circuitry 130. It should be noted that for ease of description, the term probe signal as used herein will mean any signal derived by the probes due to the part being measured and may include the range selection and measuring unit selection conditioning of the signal as described above. For the circuitry 130 utilized in this example, it is necessary to restrict the range of the probe signal from 0 volts to 2.5 volts. Diodes D-3 and D-4 shown in FIG. 6 accomplish this function. Line 162 is thus coupled to circuitry 130, whereas line 161 is coupled to the input of limit selection circuitry shown in FIG. 5.

Figures 5, 6:
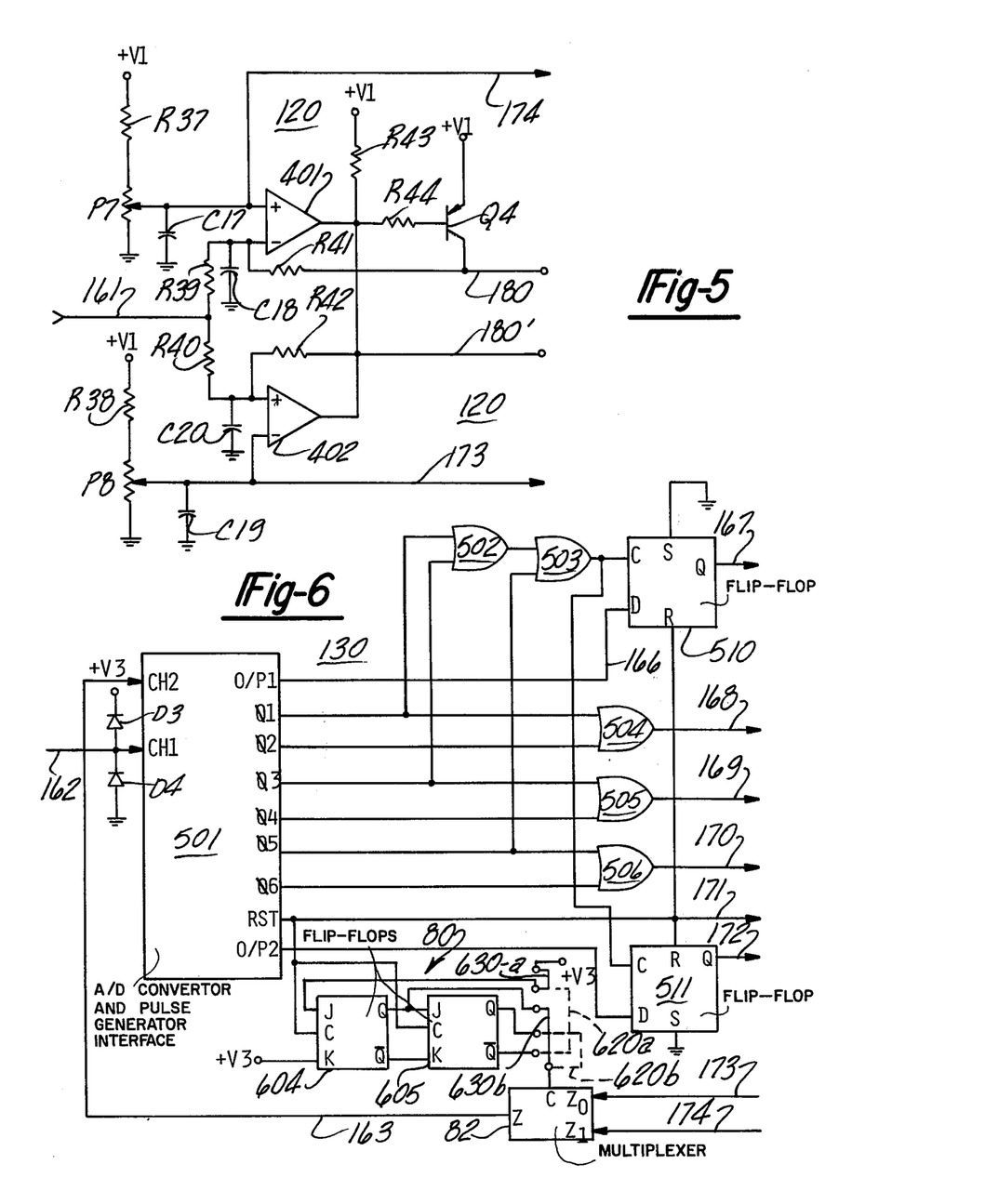
FIG. 5 is a schematic diagram showing the details of the tolerance limit setting circuitry shown in FIG. 2.
FIG. 6 is a schematic diagram showing the details of the A/D convertor and display control circuitry shown in FIG. 2.

Referring then to FIG. 5, the DC probe signal on line 161 is applied to limit selection circuitry 120 to determine if the tolerance limits have been exceeded. Circuitry 120 consists of a window comparator utilizing comparators 401 and 402. The input from line 161 is applied to the respective inputs of amplifiers 401 and 402. An electronic representation of the lower tolerance limit is provided by the setting of potentiometer P8 and is accessible on the back of display unit 16. The lower tolerance signal is applied to the other input of amplifier 402 and is applied to circuitry 130 over line 173. Similarly, the upper tolerance limit is set by utilizing potentiometer P7 which signal is coupled to other input of amplifier 401, as well as to circuitry 130 over line 174. If the probe signal on line 161 is either above or below the upper and lower tolerance limit, respectively, amplifier 401 or 402 will supply a signal of such magnitude and polarity as to turn on transistor Q4. The output line 180 from transistor Q4 can be coupled to a solid state relay which may be used to operate as a 110–220 VAC switch to external circuitry. Hence, if the probe signal exceeds the tolerance limits, the machinery producing such parts being measured can be automatically turned off. Line 180' provides a signal which can be coupled to external circuitry requiring an opposite logic convention than supplied over line 180. Additionally, if the probe signal exceeds the tolerance limits, indicator 26 of FIG. 1 is illuminated by a signal over line 180 to advise the operator that the part being measured exceeds tolerance.

Figure 7:
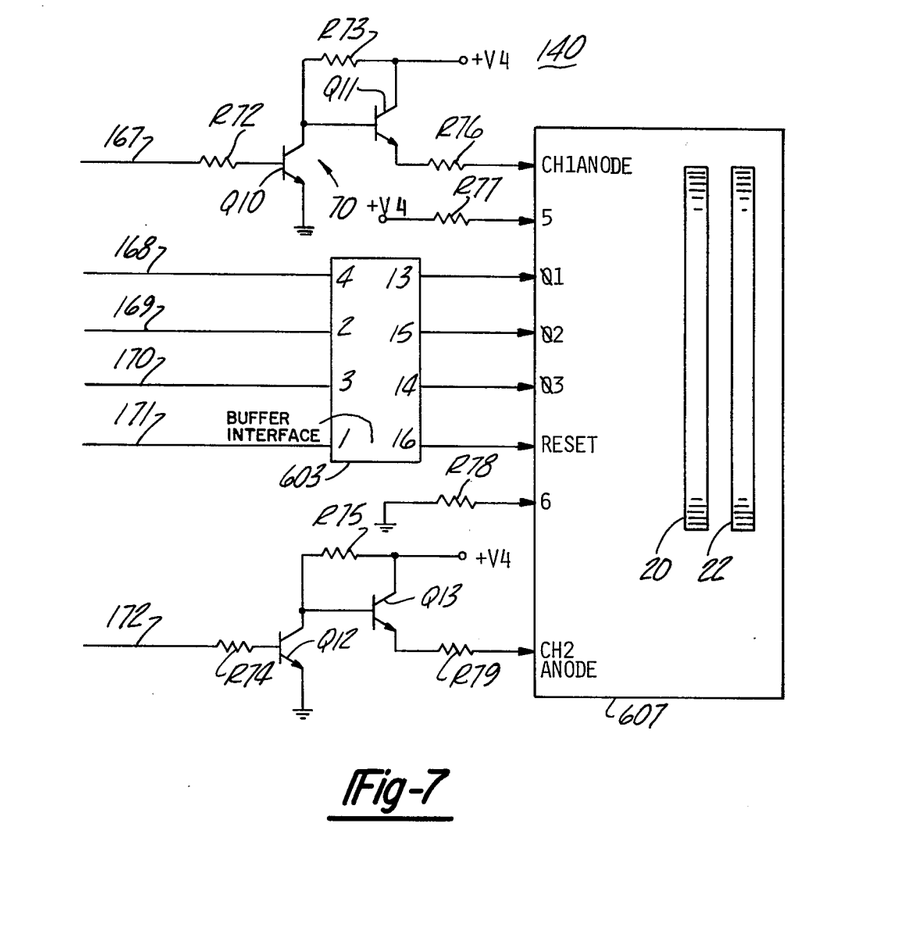
FIG. 7 is a schematic diagram showing the details of the interconnections to the bar graph shown in FIG. 2.

Turning now to FIGS. 6 and 7, the analog-digital convertor and logic circuitry 130 and display driver control circuitry 140 will be described. Block 501 represents known circuitry for converting the analog input signals to digital signals necessary to operate the bar graph display 607. Block 501 can be, for example, the Bar Graph Display Logic Circuit distributed by Signetics Corporation under Model NE580. Line 162 which carries the probe signal is coupled to the CH1 input. This signal is converted by circuit 50 to a digital pulse whose width is a function of the level of the input signal. In this example the DC level of the probe signal 162 is converted to a pulse of a width depending upon the level of the probe signal and is supplied as an output (O/P1) over line 166 which is coupled to flip-flop 510. Flip-flop 510 is utilized to provide an output over line 167 having the same pulse width as the signal on line 166, but in a properly timed fashion necessary for the particular bar graph utilized. The signal on line 167 is coupled to a Darlington pair 70 which is utilized to drive the channel one (CH1) anode of display 607. The signal driving the channel one anode controls the height of the bar graph display 20 of this invention. Gates 502–506, and flip-flops 510, 511 are utilized as known in the art to make the signals emanating from circuitry 501 compatible with the particular bar graph display utilized and therefore forms no part of this invention.

Lines 168, 169 and 170 are coupled through interface 603 to the $\phi 1$, $\phi 2$ and $\phi 3$ inputs of display 607, respectively. As is known in the art, this supplies the necessary three phase signal to operate the cathode of both bar graph display 20 and 22 required for proper operation. A reset (RST) signal is provided over line 171 to display 607 to re-initialize the scanning of the cathodes of both bar graph displays 20 and 22.

Hence, it can be seen that the probe signal is converted to a digital signal, which in turn, is applied to the channel 1 anode thereby controlling the height of bar graph display 20 as a function of the probe input signal. On the other hand, it is a feature of this invention that bar graph display 22 provides visual indications of both the upper and lower tolerance limits. This is accomplished by applying the upper and lower tolerance limit signals 173 and 174 to inputs $Z_0$ and $Z_1$ of multiplexer 82. Multiplexer 82 can be any of known devices whose output switches between one or more inputs. In this embodiment, it is an MC14053, Analog Multiplexer distributed by Motorola Semiconductors. In this invention, the output 163 of multiplexer 82 is coupled to the channel 2 (CH2) input of circuitry 501. Accordingly, whatever input is applied to CH2 is correspondingly utilized to drive the anode of bar graph display 22 in the same manner as utilized for bar graph 20. However, in this invention not only are two different inputs applied to CH2 but they are applied for different lengths of time. This is accomplished by coupling a counter network 80 between the reset (RST) pulse of circuit 501 and the enabling input C of multiplexer 82. The C input of multiplexer 82 initiates the switching between the two inputs 173 and 174. The counter circuit 80 consists of two interconnected J-K flip-flops which provide a divide by three circuit. Accordingly, counter circuit 80 provides an output pulse of one state (e.g. logical one) to the C input of multiplexer 80 only after receiving three reset pulses, whereas it provides a signal of an opposite state (e.g. logical zero) at other times. When the C input of multiplexer 82 receives a signal of logical one, multiplexer 82 couples the upper tolerance limit signal 174 to its output Z. On the other hand lower tolerance limit signal 173 is coupled to the Z output when the signal is a logical zero.

Thus it can be seen that this arrangement alternately presents voltages to the CH2 anode input of display 607 corresponding to the lower and upper tolerance limits in a 3/1 timed ratio in this example. The particular ratio can be changed if desired as long as the upper limit signal 174 is supplied often enough to prevent flicker. In this example lines 630A, 630B represent the necessary connections for a 3/1 ratio, whereas dotted lines 620A, 620B show an alternative connection for providing a 2/1 ratio. By alternately coupling the two limits to display 22 for different lengths of time, this gives the appearance of a bright section 28 on bar graph display 22 corresponding to the lower tolerance limit, followed by a dimmer section 30 on the same display 22, the height of which corresponds to the upper limit. (See FIG. 1).

As noted at the outset, while this invention has been described in connection with a part sizing system, it can find utility in a wide variety of applications. Therefore, while this invention has been described in connection with particular examples thereof, no limitation is intended thereby except as defined in the appended claims.

The embodiments of the invention in which an exclusive property or privilege is claimed are defined as follows:

1. A part sizing system comprising:
    a bar graph display device having a series of light sources which are energized by sequentially scanning portions thereof;
    first means for automatically providing an electrical signal indicative of an upper tolerance limit for a part being sized and including adjustment means for varying the signal to represent various upper tolerance limits;
    second means for automatically providing an electrical signal indicative of a lower tolerance limit for a part being sized and including means for varying the signal to represent various lower tolerance limits;
    reset means for generating a reset signal for reinitializing the scanning of the bar graph display; and
    switch means for alternately coupling the output of said first and second signal means to the bar graph display depending on the number of reset signals generated so as to superimpose visual indications of said upper and lower tolerance limits on said display, with each tolerance limit being distinguishable from the other by different light intensities.

2. The system of claim 1 wherein said switch means couples the outputs of said first and second signal means to the bar graph display for different lengths of time.

3. The system of claim 2 wherein said bar graph display is a gas plasma device having a plurality of light source segments arranged in a column, said device having a common anode portion and a plurality of cathodes which are sequentially scanned, the height of the visual indication on said bar graph being determined by the length of time that the anode is in an on state relative to one scan period of the cathodes.

4. The system of claim 3 wherein said reset means supplies a reset signal to the bar graph display for re-initializing the scan of the cathodes; and wherein switch means further includes
    a multiplexer having said first and second signal means coupled to its input, the output of said multiplexer means being coupled to the anode of said bar graph display, said multiplexer supplying either said first or second signal to its output dependent upon the number of reset pulses received.

5. The system of claim 4 wherein said switch means further comprises: a counter means coupled between said reset means and said multiplexer, with said counter means providing an enabling signal of one state after a predetermined number of reset pulses have been received and otherwise providing an enabling signal of an opposite state, said multiplexer coupling an output of said first or second signal means to its output depending upon the state of the enabling signal received from said counter means.

6. The system of claim 5 wherein said second signal means is coupled to said bar graph display through said multiplexer when said enabling signal from the counter means is in the opposite state, thereby causing the visual indication of said lower tolerance limit to have a greater intensity than that of the upper tolerance limit.

7. A part sizing system comprising:
at least one variable reluctance transducer means for providing a first output signal as a function of the size of the part being measured;
limit setting means for automatically generating second and third electrical signals respectively proportional to upper and lower tolerance limits, said limit setting means including means for varying the second and third signals to represent various upper and lower tolerance limits;
display means including first and second bar graph displays having a series of light sources which are energized by sequentially scanning portions thereof;
reset means for generating a reset signal for reinitializing the scanning of the display means; and
interface means coupling said first signal, said second signal, and said third signal to the display means, with the first signal being coupled to one bar graph display, and the second and third signals being alternately coupled to the other bar graph display depending on the number of reset signals generated so as to visually superimpose visual indications of both the upper and lower tolerance limits on the same bar graph display.

8. The system of claim 7 wherein said transducer means includes a displaceable probe which provides an output signal proportional to its displacement; and
excitation means for supplying an excitation signal to the transducer.

9. The part sizing system of claim 8 wherein the transducer excitation means further comprises:
a transformer having a primary winding and a secondary winding;
an oscillator circuit coupled to the primary winding for inducing an AC excitation signal in said secondary winding;
means for supplying a constant reference voltage;
error amplifier means for comparing said reference voltage with said excitation signal, said error amplifier means providing an error signal proportional to the difference between said reference and excitation signals; and
means for feeding said error signal back to said oscillator circuit to compensate for the difference thereby maintaining a constant excitation signal.

10. The part sizing system of claim 9 wherein said transducer excitation means further comprises:
signal rectification means for providing a DC potential level proportional to the excitation signal induced in the transformer secondary winding;
said error amplifier means further including a first input coupled to said means for supplying a constant reference voltage and a second input coupled to the output of said rectification means; and a controllable DC power supply having a control input coupled to the error amplifier means output, operative to provide DC power to said oscillator circuit to automatically adjust said excitation signal so as to maintain said error amplifier means output at a zero level.

11. The part sizing system of claim 10 wherein said oscillator circuit further comprises capacitance means coupled to the primary winding of the transformer to thereby form a resonant tank circuit.

12. The part sizing system of claim 7 wherein said second and third signals are alternately coupled to the other bar graph display for different lengths of time thereby causing superimposed visual indications of both the upper and lower tolerance limits on the same bar graph display, with said indications being distinguishable from each other by different light intensities.

13. The part sizing system of claim 12 wherein each of said bar graph displays includes an anode and a plurality of cathodes, the height of the bar graph visual indication being dependent upon the length of time that the anode is in an on state when said cathodes are sequentially scanned.

14. The part sizing system of claim 13 wherein said interface means further comprises:
a first output means for driving the anode of one bar graph display, second output means for driving the anode of said other bar graph display said reset means including, third output means for supplying scanning signals to the cathodes of both displays, fourth output means for providing a reset signal to re-initialize the scanning of the cathodes;
multiplexer means having one input receiving the upper tolerance limit signal and a second input receiving the lower tolerance limit signal, said multiplexer means supplying either said upper or lower tolerance limit signal to an input of the interface means associated with said second output means for driving the anode of the other bar graph display, said multiplexer means supplying said upper and lower tolerance limit signals to the interface input for different lengths of time depending upon the number of reset signals.

15. The part sizing system of claim 14 which further comprises:
counter means coupled between said fourth reset output and an enabling input of said multiplexer means, said counter means providing a signal of one state when a predetermined number of reset pulses has been received and otherwise providing an output of an opposite state to the enabling input of the multiplexer means, with said multiplexer means supplying said upper tolerance limit signal to the interface input associated with said second output means upon receipt of a signal of said one state from the counter means, and supplying said lower tolerance limit signal to the interface input associated with said second output means when the signal from the counter means is in said opposite state.

16. The part sizing system of claim 15 wherein said counter means comprises a plurality of flip-flops which are coupled together so as to provide an output signal of said one state after receipt of a predetermined plurality of reset pulses.

17. A part sizing system comprising:
at least one variable reluctance transducer;

transducer excitation means coupled to each transducer;

signal conditioning means coupled to each system transducer output and to the excitation means, operative to generate at an output a first DC potential that is a function of the system transducer outputs;

limit setting means for generating second and third DC potentials respectively proportional to upper and lower tolerance limits for a part being measured;

display means including first and second continuous bar graph indicating means having a series of light sources which are energized by sequentially scanning portions thereof;

reset means for generating a reset signal to reinitialize the scanning of the display means; and interface means coupled to the signal conditioning means and to the limit setting means, operative to convert the first, second, and third DC potentials into corresponding pluralities of digital control signals, said interface means coupling said digital control signals associated with said first DC potential to the first bar graph means to provide a visual indication that is a function of the transducer outputs, with the interface circuit alternately coupling the digital control signals associated with said second and third DC potentials to said second bar graph means depending upon the number of reset signals generated so as to provide visually superimposed indications of the upper and lower tolerance limits, each limit indication being distinguishable from the other by different light intensities.

18. A part sizing system as set forth in claim 17 wherein the transducer excitation means further comprises:

capacitance means and a transformer having a primary winding and a center-tapped bifilar secondary winding, the primary winding and capacitance means interconnected as a resonant tank circuit, the outer terminals of the secondary winding being coupled to an excitation means output for providing a transducer excitation signal;

signal rectification means having an input coupled to the outer terminals of the secondary winding, operative to generate a DC potential level proportional to the excitation signal;

error amplifier means having a first input coupled to a DC reference potential and a second input coupled to a rectification means output, operative to generate an error potential at an error amplifier means output indicative of the difference of the signals at its input; and a controllable DC power supply having a control input coupled to the error amplifier means output, operative to provide DC power to the resonant tank circuit at a level determined by the error potential.

19. A part sizing system as set forth in claim 18 wherein the signal rectification means further comprises:

a shunt chopper circuit switching in synchronous time relation to the excitation signal, operative to generate a half-wave rectified version of the excitation signal; and filter means coupled between the shunt chopper circuit and the error amplifier means.

20. A part sizing system as set forth in claim 17 wherein the interface means further comprises:

first analog to digital convertor means having an input coupled for receipt of the first DC potential;

multiplexing means having first and second inputs coupled for respective receipt of the second and third DC potentials, second analog to digital convertor means having an input coupled to an output of the multiplexing means; and timing means coupled to an enabling input of the multiplexing means, operative to control the time duration during which particular multiplex means inputs are directly transmitted to the multiplex means output.

21. A part sizing system as set forth in claim 20 wherein the timing means further comprises:

counting means coupled to the interface means, operative to couple a control signal pulse to the multiplexing means enabling input upon receiving a predetermined integral number of said reset pulses.

22. A part sizing system as set forth in claim 21 wherein the integral number equals 3.

23. A part sizing system as set forth in claim 17 wherein the signal conditioning means further comprises:

adjustable means for selectively varying a size range to be associated with the visual indications provided by the display means.

24. A part sizing system as set forth in claim 17 wherein the signal conditioning means further comprises:

adjustable means for selectively determining the measuring unit system to be associated with the visual indications provided by the display means.

25. A part sizing system as set forth in claim 17 wherein the first DC potential is proportional to the sum of all system transducer outputs.

26. A part sizing system as set forth in claim 25 further comprising:

switching means coupling at least one transducer to the excitation means, operative in a first position to cause its associated transducer to produce an output signal of a first sense in response to displacement of the transducer caused by the part under test, and operative in a second position to cause its associated transducer to produce an output signal of an opposite sense.

27. A part sizing system as set forth in claim 26 wherein the limit setting means further comprises:

first and second adjustable means for respectively varying the second and third DC potentials.

28. A part sizing system as set forth in claim 27 wherein the limit setting means further comprises:

means for coupling a signal conditioning means output to a limit setting means input;

means for comparing the first DC potential from the signal conditioning means with the second and third DC potentials, and for generating an output signal whenever the first DC potential level is not between the second DC potential and the third DC potential.

29. An electronic column gauge comprising:

first and second variable reluctance transducers, transducer excitation means and switch means coupling the excitation means to inputs of the first and second transducers;

signal conditioning means coupled to outputs of the first and second transducers and to the excitation means, including means for summing the transducer outputs whenever the switch means is in a first position and for subtracting the second transducer output from the first transducer output whenever the switch means is in a second position, demodulation means for generating a first DC potential proportional to a signal generated by the means for summing and subtracting;

limit setting means having an input coupled to an output of the signal conditioning means, means for generating selectively variable second and third DC potentials respectively proportional to upper and lower tolerance limits for a part being sized, and a window comparator operative to generate a system output signal whenever the first DC potential is not between the second DC potential and the third DC potential;

interface means coupled to the signal conditioning means and to the limit setting means, operative to convert the first, second, and third DC potentials into corresponding pluralities of digital control signals; and display means including first and second bar graph indicating means having a plurality of gas plasma light sources, said display means coupled to corresponding pluralities of digital control signals and operative to provide a visual indication on the first bar graph means of a level proportional to the first DC potential, and to visually superimpose indications on the second bar graph means of second and third levels respectively proportional to the second and third DC potentials.

30. A column gauge as set forth in claim 29 wherein the transducer excitation means further comprises:

capacitance means and a transformer having a primary winding and a bifilar secondary winding with a grounded center tap, the primary winding and capacitance means interconnected as a resonant tank circuit, the outer terminals of the secondary winding coupling a transducer excitation signal to the switch means;

signal rectification means having an input coupled for receipt of the excitation signal, operative to generate a DC potential proportional to the excitation signal;

an error amplifier having a first input coupled to a DC reference potential and a second input coupled to the DC potential generated by the rectification means, operative to generate an error signal; and a controllable DC power source operative to couple DC power to the resonant tank circuit at a level determined by the error signal.

31. A column gauge as set forth in claim 30 wherein the signal rectification means further comprises:

a shunt chopper circuit switching in synchronous time relation to the excitation signal, operative to generate a half-wave rectified version of the excitation signal; and smoothing filter means coupled between the shunt chopper circuit and the error amplifier.

32. A column gauge as set forth in claim 30 wherein the interface means further comprises:

a first analog to digital converter having an input coupled for receipt of the first DC potential;

multiplexing means having first and second inputs coupled for respective receipt of the second and third DC potentials;

a second analog to digital convertor having an input coupled to an output of the multiplexing means; and timing means coupled to an enabling input of the multiplexing means, operative to control the time durations during which particular multiplex means inputs are directly transmitted to the multiplex means output.

33. A column gauge as set forth in claim 32 wherein the timing means further comprises:

a counter coupled to an interface means output, operative to couple a control pulse to the multiplexing means enabling input every third operating cycle of the interface means for energizing the light sources.

34. A column gauge as set forth in claim 30 wherein the signal conditioning means further comprises:

first adjustable means for selectively determining a size range to be associated with the visual indications provided by the display means; and a unit select switch, operative in a first position to cause an English system scale factor to be associated with the visual indications, and operative in a second position to cause a metric system scale factor to be associated with the visual indications.

* * * * *